United States Patent [19]

Ford

[11] 4,114,117
[45] Sep. 12, 1978

[54] TUNABLE ELECTRICAL FILTER NETWORK

[76] Inventor: Michael Alan Ford, 7 Islet Park House, Islet Park, Maidenhead, Buckinghamshire, England

[21] Appl. No.: 754,643

[22] Filed: Dec. 27, 1976

[30] Foreign Application Priority Data

Jan. 7, 1976 [GB] United Kingdom ............ 00427/76

[51] Int. Cl.² ............................................. H03H 7/10
[52] U.S. Cl. ............................ 333/70 CR; 356/96; 328/167; 333/70 A
[58] Field of Search .................. 356/96; 328/167; 307/233 R; 333/70 A, 70 CR, 70 R

[56] References Cited

U.S. PATENT DOCUMENTS

| | | | |
|---|---|---|---|
| 3,409,373 | 11/1968 | Matthews | 356/96 |
| 3,526,858 | 9/1970 | Heinlein et al. | 333/70 R |
| 3,549,903 | 12/1970 | Lowdensiager | 307/237 |
| 3,604,947 | 9/1971 | Puthuff | 328/167 |
| 3,669,551 | 6/1972 | Bucher et al. | 356/96 |
| 3,701,059 | 10/1972 | Nyswander | 333/70 A |
| 3,895,315 | 7/1975 | Way | 356/96 |
| 3,930,727 | 1/1976 | Vergato | 356/96 |

Primary Examiner—Alfred E. Smith
Assistant Examiner—Harry E. Barlow
Attorney, Agent, or Firm—Salvatore A. Giarratana; Francis L. Masselle; John D. Crane

[57] ABSTRACT

A tunable electrical filter is disclosed wherein an RC (resistor-capacitor) network comprising a plurality of switchable capacitors among the components determining the time constant of the filter provides a given minimum value of filter time constant and, therefore, a given minimum bandwidth, when all the capacitors are continuously connected in the network. Each capacitor is coupled to the network through the output means of an electronic switching means. A pulse generator connected to the input means of said switching means provides a train of pulses having an adjustable ON-time to OFF-time ratio. When all the capacitors are periodically switched by the output of the pulse generator, the effective filter time constant increases from said given minimum value as the ON-time compared with the OFF-time decreases. The pulse generator is provided with control means for adjusting the ON-time to OFF-time ratio. Operation of the control means will, therefore, enable the filter to be tuned within a predetermined range.

10 Claims, 3 Drawing Figures

TUNABLE ELECTRICAL FILTER NETWORK

BACKGROUND OF THE INVENTION

The present invention relates in general to tunable electrical filters of the type comprising an RC (resistance-capacitance) network for determining the effective filter time constant, and in particular to tunable filters which include at least one operational amplifier in said network.

In the simplest of filters of the above type, the network may consist of a single resistor and a single capacitor. In general, however, much more complex networks are required to meet the requirements of many filter applications calling for exacting frequency response characteristics. For example, this is especially true of low-pass filters for use ahead of a read out device, such as a chart recorder or digital display in scanning spectrophotometers.

The fundamental parameter that plays a part in any filter characteristic is of course the effective time constant. In the simplest of filters, it is merely the product of one resistor value and one capacitor value. In more complex filters, the RC network may include several RC combinations, each with its own time constant, so that the effective time constant is the result of the interaction between the various combinations.

Tunable filters, in which the effective time constant may be varied over a predetermined range, are often required for the purpose of matching changing operational requirements. It is easy to imagine the complexity and attendant functional unreliability of the switching system required to select the large number of RC permutations needed to cover even a modest range in, say, a third-order filter. Not surprisingly, therefore, variable time-constant filters have hitherto tended to be of the simplest first-order kind, providing a generally unsatisfactory performance in all but the less demanding situations.

The feature in the low-pass characteristic of a tunable noise filter for use in a scanning spectrophotometer, therefore, which is of particular interest is the cut-off frequency, which sets the upper limit of the noise bandwidth and may be altered by inversely varying the effective time constant of the filter. It may be proved mathematically, although it is easy to appreciate it intuitively, that optimum filtering, i.e. maximum noise attenuation with minimum signal distortion, may be obtained if the filter is arranged to have a comparatively sharp cut-off around the highest frequency expected in the signal. Now, for any sample under analysis the highest signal frequency is naturally determined by the rate at which the ordinate information is made available, or in other words by the rate of abscissa generation, i.e. the rate of wavenumber or wavelength scan. The faster the scan, the higher must be the filter cut-off frequency to cope with it; but the higher the cut-off frequency and, consequently, the wider the bandwidth, the greater the noise.

In an application of particular interest, a scanning spectrophotometer, resolution, signal-to-noise and scan speed are three major interrelated parameters, resolution being most frequently regarded as the leading parameter. In practice, the operator typically decides first on the minimum resolution required for the analysis in hand and adjusts the filter bandwidth to ensure that the signal-to-noise ratio is adequate. The scan speed required then becomes a consequential adjustment in that it must not exceed the limit at which the incoming information rate would be too high for the cut-off frequency selected. This procedure ensures that a satisfactory spectrum is obtained in a minimum of time.

Resolution is of course improved by reducing the opening of the monochromator slits, but this reduces the amount of energy reaching the photometric detector and leads, therefore, to a lower signal-to-noise ratio of the detector output signal, which is compensated for by decreasing the filter bandwidth, i.e. by increasing filtering. Because of the greatly differing spectra handled by a spectrophotometer, a large range of resolution values must be provided for in its design. This inevitably means that a wide selection of filter bandwidths must also be included, which is tantamount to saying that the range of filter cut-off frequencies and consequently effective filter time constant must be large, typically in the region of 100:1.

In prior art scanning spectrophotometers an attempt has been made to produce variable bandwidth filters in which different value resistors and capacitors are switched in and out through an operator control. Because of the intolerable complexity that would result with higher order filters, the scheme has been confined to simple first order RC filters, which unfortunately do not allow the optimum filtering conditions desired to be closely approached.

It is a primary object of the present invention to provide a tunable filter in which all the time-constant determining capacitors of an RC network forming part of the filter are adapted to be switched at a variable ON-time to OFF-time ratio, the time constant of the network increasing as the ratio decreases.

It is a further object of the present invention to provide a spectrophotometer incorporating the said tunable filter in the form of a low-pass noise filter.

SUMMARY OF THE INVENTION

These and other objectives may be realized in accordance with the present invention by providing a tunable electrical filter system, comprising an RC network for the determination of the effective filter time constant and a switching system for periodically switching the capacitative means in said network from a charge accumulating state to a charge memorizing state at a controlled mark-space ratio (i.e. ON-time to OFF-time ratio) so that in operation the effectiveness of said capacitative means in said determination is altered in relation to said ratio and consequently the said time constant is likewise altered.

The phrase "mark-space ratio" is well understood in the electronic art. At all events, we confirm that it is intended to refer to the ratio of the ON-time ($T_{on}$) of the switching system to the OFF-time ($T_{off}$). Denoting this ratio by R, we have therefore: $R = (T_{on}/T_{off})$.

Towards the accomplishment of the said objectives there is more specifically provided a tunable filter comprising an RC network including a plurality of capacitors in the portion of the network that determines the time constant of the filter. When all the capacitors are in circuit, the filter time constant is at its lowest value of the range over which the filter may be tuned, and, consequently the filter bandwidth is at its narrowest.

Said switching system may include a plurality of electronic switching means, each having input means and output means and each co-operating with one of said capacitors. The output means of a given switching means is connected to control the periodic switching of a given capacitor in and out of the network. The input means of said given switching means is coupled to the output of a pulse generator having means for varying the ON-time to the OFF-time ratio of a train of output pulses representing a switching waveform.

Now, when the switching waveform at the input means of each switching means is at a sustained electrical level, all the capacitors are in circuit all the time the level is maintained and the filter time constant is at said lowest value; and when the switching waveform exhibits gradually decreasing ON-time periods compared with the OFF-time periods the time constant will gradually increase. In this manner the filter may be tuned over a continuous range by simply varying the ON-time to the OFF-time ratio of the switching waveform.

For a proper appreciation of how the switching system and the capacitative means co-operate it is worth noting that if at any point along the filter impulse characteristic the capacitative means is open-circuited (i.e. switched to the charge memorizing state), the filter must remain "frozen" at the said point, i.e. the filter must hold, since the capacitative means can neither acquire nor lose charge until it is switched on again (i.e. to the charge accumulating state), when the filter will resume functioning from the said point as if no interruption in the information signal had taken place.

By causing the switching system to operate fast (relative to the highest frequency of the information signal) at a controlled mark-space ratio, the resulting impulse response will simply be the design response fragmented in elemental portions (corresponding to said charge accumulating state) each separated from the next by a constant value portion (corresponding to said charge memorizing state). If the mark space ratio is, say, 1, giving therefore a duty cycle of 50%, the effect of introducing the constant value portions (each representing the terminal value of the preceding elemental portion) in the impulse response is to spread the response by a factor of 2 in the time scale, or in other words double the effective time-constant, which is equivalent, of course, to halving the cut-off frequency. If the mark-space ratio tends towards infinity, the capacitative means is in circuit all the time and the cut-off frequency is at its design maximum; if the ratio is zero, the cut-off frequency is also zero, which means that the filter holds the output level present before the ratio turned to zero, regardless of input changes.

The said switching system may be adapted to respond to a pulse generator for providing a switching waveform in which said mark-space ratio is represented either by width modulated pulses in conjunction with a constant p.r.f. (pulse repetition frequency) or preferably by constant-width pulses in conjunction with a modulated p.r.f.

The said pulse generator, which may form part of said filter system, is made to provide a p.r.f. which is sufficiently high, having regard to information theory, to be compatible with the highest frequency of the information signal.

The switching system preferably includes electronic switching means offering the highest practical impedance when off and the lowest impedance when on. In the present state of the art, FET (field effect transistor) devices would be preferred.

Sample-and-hold means switchable with the capacitative means may be provided as part of said filter system or the system may be adapted for connection with such sample-and-hold means. If the filter system includes a terminal virtual earth summing amplifier as part of the design for obtaining a desired filter characteristic, said amplifier may be used as the switchable sample-and-hold means. At all events said means enable the information signal value corresponding to the point attained on the filter impulse characteristic immediately prior to switching off the capacitative means to be retained to enable the filter to resume operation, when the capacitative means is switched on again, as if no interruption of the information signal had taken place while securing the benefits of a low output impedance.

DETAILED DESCRIPTION OF THE PREFERRED EMBODIMENT

The present invention may be more readily understood through the outlining of a practical embodiment thereof in the specific context of a well recognized application of tunable filters as represented by the low-pass noise filter that feeds into the read out, e.g. chart recorder, of a scanning spectrophotometer. As the description proceeds, the general applicability of the invention will be better appreciated than if a strictly generalized.

Figure 1:
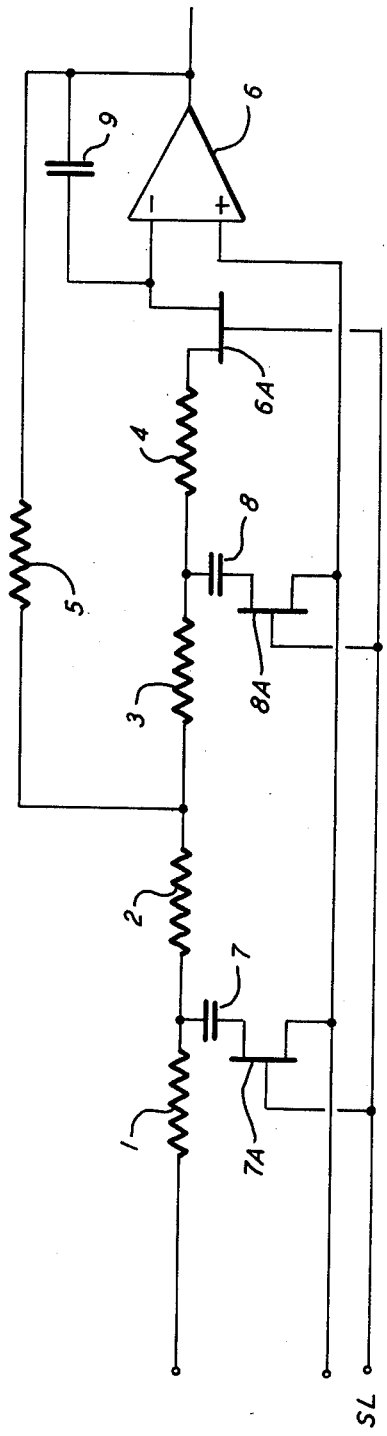
FIG. 1 illustrates the invention as applied to a Shumard-type third-order filter.

FIG. 1 of the attached diagrammatic drawings illustrates the invention as may be applied to a basic low-pass, Shumard-type, third-order filter for filtering the noise of a scanning spectrophotometer output. The RC network is seen to include 4 series-connected resistors: resistor 1 having a suitable value V; resistor 2 and 3, each of value 2V; and resistor 4 equal to resistor 1. A further resistor 5 is in the negative feedback loop of the operational amplifier 6 that feeds into the junction between resistors 2 and 3.

The capacitative means include equal-value capacitors 7 and 8, the former having one terminal connected to the junction between resistors 1 and 2 and the other a terminal connected to the junction between resistors 3 and 4. A feedback capacitor 9 is strapped between input and output of amplifier 6.

In accordance with the present invention, capacitor 7 may be connected to ground through FET 7A and capacitor 8 may be similarly connected through FET 8A. In addition, an FET 6A is provided between the resistor 4 and the input of amplifier 6. The gates of all FET's are commoned to a switching line SL through which the switching waveform from a pulse generator (not shown) controlled by a time-constant selection unit (not shown) is available for switching the FET's at a mark-space ratio representing the selected effective filter time constant.

Currently available FET devices suffer from a small but significant charge storing effect due to interelectrode capacitance. If pulse width modulation is used in carrying the present invention into effect, account must be taken of the fact that the charge and discharge characteristics of the said capacitance are different, which means that an error is introduced in the filter output in passing from a narrow to a wide switching pulse or vice versa. The problem can be mitigated by selecting FET's with a very low interelectrode capacitance and by compensatory circuit design, but a better solution is to modulate the p.r.f. as indicated above.

Whether width or p.r.f. modulation is employed, the filter tuning function may be simply carried into effect by controlling through a single resistor the switch over time of a monostable forming a basic part of the pulse generator. By selecting any one of a range of fixed resistors, a corresponding predetermined time-constant value may be brought into operation. Alternatively, a variable resistor would enable continuous tuning to be carried out over a predetermined range.

Figure 2:
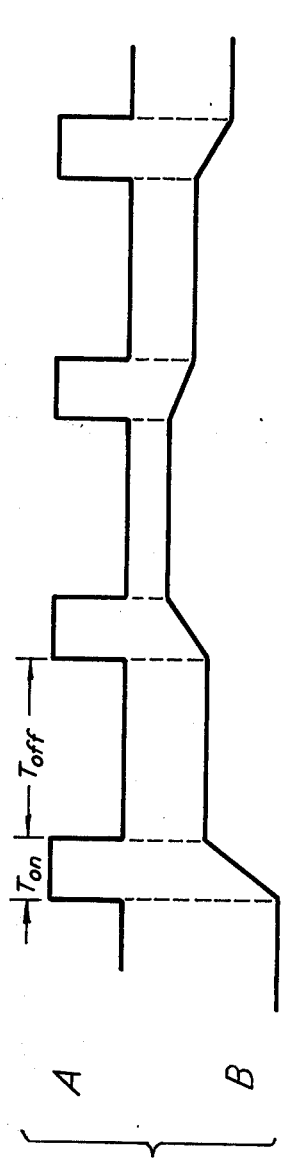
FIG. 2 illustrates the switching waveforms of the circuit in FIG. 1.

FIG. 2 illustrates the switching waveform and the filter output when p.r.f. modulation is used and a medium-value time constant has been selected. Curve A represents the switching waveform including a constant-width switching pulse SP followed by a comparatively long OFF-time. Curve B illustrates part of the filter output for a single impulse input including elemental portions of the design response such as EP, coincident with the ON-time of the FET's, each followed by a portion representing the terminal value of the preceding elemental portion sustained unchanged for the whole of the OFF-time.

Figure 3:
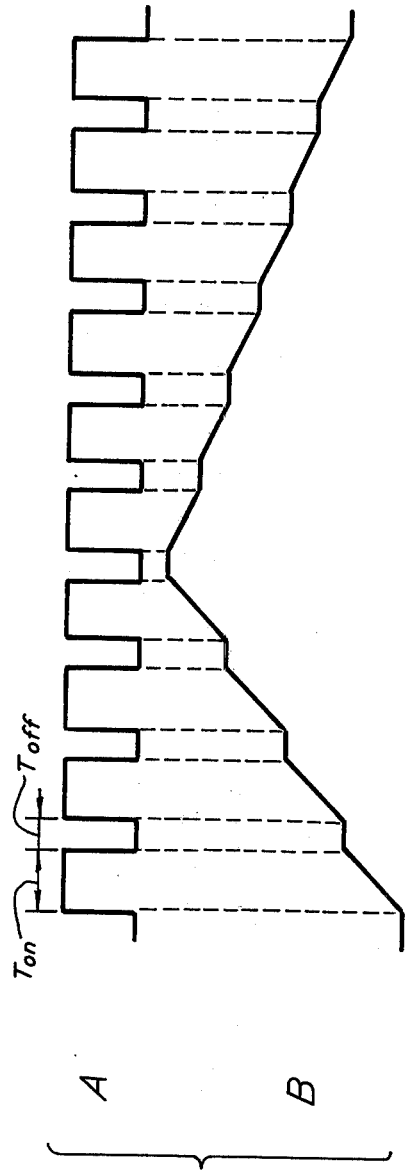
FIG. 3 illustrates the switching waveforms of the circuiy in FIG. 1 where a short time constant is selected.

FIG. 3 represents the same two curves A and B when a comparatively short time constant has been selected. Because the p.r.f. has been increased, the OFF-time of the FET's has decreased and consequently the portions held at constant value in curve B of FIG. 3 have now contracted. If the p.r.f. is increased further, a point will be reached where the response characteristic will include no appreciable constant-value portions and the shortest time constant will become operative.

While it would be feasible to switch the resistive means of the RC network, the switching of the capacitative means offers several advantages. To start with, there are usually fewer capacitors than resistors in the network. Furthermore, the capacitors have one side grounded, which makes it easy to return them to ground through any convenient form of switching means. In addition, the capacitors retain the value accrued in them up to the point of switching them off and this means that whether the filter includes a switched terminal operational amplifier or not the filter is capable of performing a holding function.

Other variations of the embodiment described will be apparent to those of ordinary skill in the art. Thus the scope of the present invention is not to be limited by the particulars of the description above, but rather only by the breadth of the claims which follow.

What is claimed is:
1. In a tunable electrical filter the combination of:
  a. an RC network for determining the smallest value of time constant and therefore the narrowest bandwidth of the filter, said network comprising a plurality of capacitors;
  b. a plurality of electronic switching means each having input means and output means, the output means of a given switching means being connected to a given capacitor to control the switching thereof in and out of the network; and
  c. means for varying the ON-time to OFF-time ratio of a train of output pulses connected to the input of each switching means for providing a switching waveform thereat, whereby in operation the time constant of the filter may be varied from said smallest value upwards within a predetermined range by simultaneously switching all the capacitors in and out of the network at a selected ON-time to OFF-time ratio.

2. The combination of claim 1, wherein one output terminal of said given switching means is grounded and the other terminal is connected to a terminal of said given capacitor.

3. The combination of claim 1, comprising sample and hold means switchable simultaneously with the capacitors for retaining during the OFF-time period of the switching waveform the value of the filter output signal attained at the onset of said OFF-time period.

4. The combination of claim 3, wherein said sample and hold means in an integrating amplifier forming part of the output end of the filter network and a further electronic switching means is provided to switch on and off the input of the amplifier simultaneously with the switching on and off of the capacitors.

5. The combination of claim 1, wherein the ON-time to OFF-time ratio is determined by maintaining the p.r.f. (pulse repetition frequency) constant and controlling the duration of the ON-time.

6. The combination of claim 1, wherein the ON-time to OFF-time ratio is determined by maintaining the ON-time constant and controlling the p.r.f.

7. In a spectrophotometer comprising a tunable low-pass noise filter for filtering the ordinate signal of the spectrophotometer ahead of the spectrophotometer read out means, the combination of;
  a. an RC network for determining the smallest value of the filter time constant and hence the narrowest filter bandwidth, said network comprising a plurality of capacitors;
  b. a plurality of electronic switching means each having input means and output means, the output means of a given switching means being connected to control the switching of a given capacitor in and out of the network;
  c. means for varying the ON-time to OFF-time ratio of the output pulses being connected to the input means of each switching means for providing a switching waveform thereat,
  d. an integrating amplifier at the output end of said network; and
  e. a further electronic switching means having output means connected to control the switching in and out of the network of the amplifier input and having input means connected to said means for varying the ON-time to OFF-time ratio.

8. The spectrophotometer of claim 7, wherein one output terminal of said given switching means is grounded and the other terminal is connected to a terminal of said given capacitor.

9. The spectrophotometer of claim 7, wherein the ON-time to OFF-time ratio is determined by maintaining the p.r.f. constant and controlling the duration of the ON-time.

10. The spectrophotometer of claim 7, wherein the ON-time to OFF-time ratio is determined by maintaining the ON-time constant and controlling the p.r.f.

* * * * *